United States Patent
Feshali et al.

(10) Patent No.: US 10,541,214 B2
(45) Date of Patent: Jan. 21, 2020

(54) ENHANCED BONDING BETWEEN III-V MATERIAL AND OXIDE MATERIAL

(71) Applicant: Juniper Networks, Inc., Sunnyvale, CA (US)

(72) Inventors: Avi Feshali, Sunnyvale, CA (US); John Hutchinson, Santa Barbara, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 15/965,054

(22) Filed: Apr. 27, 2018

(65) Prior Publication Data

US 2019/0333873 A1    Oct. 31, 2019

(51) Int. Cl.
| | |
|---|---|
| *H01L 23/00* | (2006.01) |
| *H01L 27/12* | (2006.01) |
| *H01L 29/20* | (2006.01) |
| *H01L 21/02* | (2006.01) |
| *H01L 29/06* | (2006.01) |
| *H01L 21/74* | (2006.01) |
| *H01L 21/306* | (2006.01) |

(52) U.S. Cl.
CPC ...... *H01L 23/564* (2013.01); *H01L 21/02164* (2013.01); *H01L 21/306* (2013.01); *H01L 21/746* (2013.01); *H01L 27/1203* (2013.01); *H01L 29/0649* (2013.01); *H01L 29/20* (2013.01)

(58) Field of Classification Search
CPC ............. H01L 23/564; H01L 21/02164; H01L 27/1203; H01L 29/0649; H01L 29/20
USPC .......................... 257/629, 701, 682; 438/455
See application file for complete search history.

(56) References Cited

U.S. PATENT DOCUMENTS

| | | | |
|---|---|---|---|
| 6,279,585 B1 * | 8/2001 | Shiraki | H01L 21/32134 134/1.3 |
| 2005/0127470 A1 * | 6/2005 | Akiyama | H01L 21/76264 257/506 |

(Continued)

FOREIGN PATENT DOCUMENTS

CN    110416224    11/2019

OTHER PUBLICATIONS

"European Application Serial No. 19165636.2, Extended European Search Report dated Sep. 9, 2019", 9 pgs.

*Primary Examiner* — Robert T Huber
(74) *Attorney, Agent, or Firm* — Schwegman Lundberg & Woessner, P.A.

(57) ABSTRACT

When III-V semiconductor material is bonded to an oxide material, water molecules can degrade the bonding if they become trapped at the interface between the III-V material and the oxide material. Because water molecules can diffuse readily through oxide material, and may not diffuse as readily through III-V material or through silicon, forcing the III-V material against the oxide material can force water molecules at the interface into the oxide material and away from the interface. Water molecules present at the interface can be forced during manufacturing through vertical channels in a silicon layer into a buried oxide layer thereby to enhance bonding between the III-V material and the oxide material. Water molecules can be also forced through lateral channels in the oxide material, past a periphery of the III-V material, and, through diffusion, out of the oxide material into the atmosphere.

20 Claims, 10 Drawing Sheets

(56) References Cited

U.S. PATENT DOCUMENTS

2012/0119258 A1     5/2012  Liang
2016/0276370 A1*    9/2016  Miyairi ............... H01L 21/8258
2016/0306111 A1*   10/2016  Lambert .............. H05K 999/99

* cited by examiner

ENHANCED BONDING BETWEEN III-V MATERIAL AND OXIDE MATERIAL

FIELD OF THE DISCLOSURE

The present disclosure relates generally to bonding of III-V semiconductor material to oxide material during manufacture of integrated circuits, for example, photonic integrated circuits.

BACKGROUND OF THE DISCLOSURE

During manufacture of integrated circuits, Ill-V semiconductor material can be bonded to oxide material. Water molecules can degrade the bonding if they become trapped at the interface between the III-V semiconductor material and the oxide material.

Figure 1:
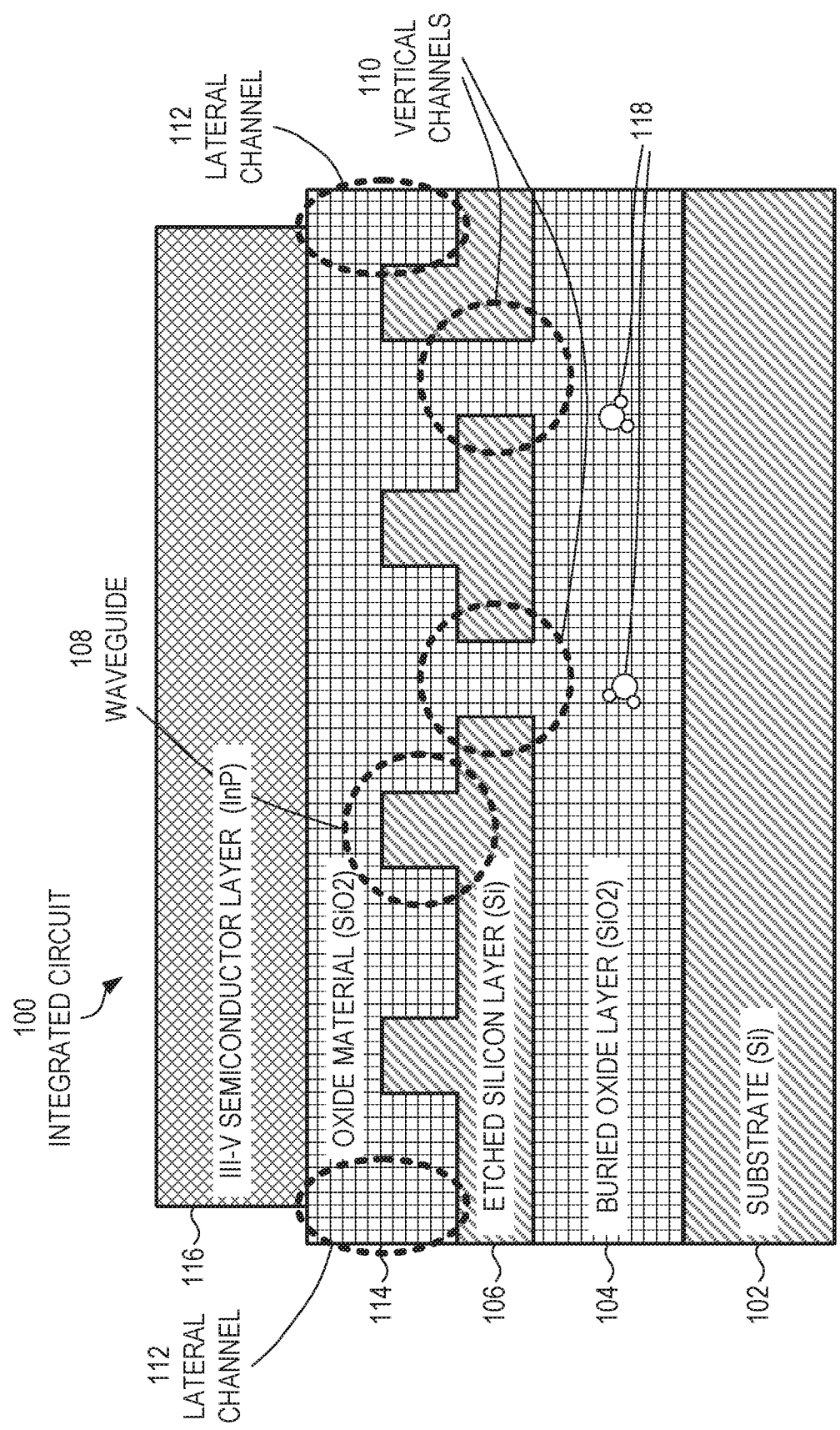
FIG. 1 shows a side-view cross-section of an example of an integrated circuit, in accordance with some embodiments.

Corresponding reference characters indicate corresponding parts throughout the several views. Elements in the drawings are not necessarily drawn to scale. The configurations shown in the drawings are merely examples, and should not be construed as limiting the scope of the inventive subject matter in any manner.

DETAILED DESCRIPTION

When III-V semiconductor material is bonded to an oxide material, water molecules can degrade the bonding if they become trapped at the interface between the III-V semiconductor material and the oxide material. Because water molecules can diffuse readily through oxide material, and may not diffuse as readily through III-V semiconductor material or through silicon, forcing the III-V semiconductor material against the oxide material can force water molecules at the interface into the oxide material and away from the interface. The structures discussed below can provide two mechanisms for transporting the water molecules away from the interface, thereby enhancing bonding between the III-V semiconductor material and the oxide material.

In a first mechanism, the water molecules can be forced through fully-etched portions of a silicon layer, through vertical channels, into a buried oxide layer, which can function like a large reservoir of absorptive material that can absorb water molecules as needed. This first mechanism can transport water molecules along a vertical direction (e.g., in a direction perpendicular to a plane of the silicon layer and the buried oxide layer).

In a second mechanism, the water molecules can be forced into lateral channels formed in partially-etched portions of the silicon layer. The lateral channels can transport the water molecules past a periphery of the III-V semiconductor material, and, through diffusion, out of the oxide layer into an atmosphere surrounding the periphery of the III-V semiconductor material and adjacent the planarized oxide layer. This second mechanism can transport water molecules along a lateral direction (e.g., within the plane of the silicon layer and the buried oxide layer).

In some examples, the first mechanism can be used without the second mechanism. In other examples, the second mechanism can be used without the first mechanism. In still other examples, the first and second mechanisms can be used in combination. In some of these examples, some vertical channels can connect with some lateral channels.

After the water molecules have been forced away from the interface, there can be subsequent wafer-level processing, including dicing into individual components.

FIG. 1 shows a side-view cross-section of an example of an integrated circuit 100, in accordance with some embodiments. The integrated circuit 100 is shown after assembly but prior to dicing. The integrated circuit 100 is but one example of an integrated circuit; other integrated circuits can also be used.

At least a portion of the integrated circuit 100 can be formed on a silicon-on-insulator wafer, which can include a substrate 102, a buried oxide layer 104 disposed on the substrate 102, and a silicon layer 106 disposed on the buried oxide layer 104. In some examples, the silicon-on-insulator wafer can be ordered from a wafer manufacturer, and provided as an integrated unit as starting material for subsequent processing. Alternatively, the buried oxide layer 104 can be grown or deposited on the substrate 102, and the silicon layer 106 can be grown or deposited on the buried oxide layer 104.

The substrate 102 can play a largely structural role in the device, and can serve as a platform on which other layers or components are deposited, grown, or attached. In general, the light propagating in waveguides and other optical elements on the silicon-on-insulator wafer can be confined away from the substrate 102, so that the substrate 102 typically does not play an optical role in a finished device.

In some examples, the substrate 102 can be formed from silicon (Si). Silicon is widely used as substrate material because it has relatively high strength, is relatively inexpensive, and is easily processed using typical wafer-level techniques. A typical thickness for the silicon substrate 102 is 750 microns, or a value between 725 microns and 775 microns, although other thicknesses can also be used. A silicon substrate 102 is typically round, with a diameter of 200 mm, 300 mm, or a value between 200 mm and 300 mm, although other diameters can also be used. Square silicon substrates 102 of appropriate sizes, or other suitable shapes, can also be used.

A buried oxide layer 104 can be disposed on the substrate 102. The buried oxide layer 104 can act as an electrical insulator for components or layers that are positioned above the buried oxide layer 104 (e.g., on the side of the buried oxide layer 104 opposite the substrate 102).

In some examples, the buried oxide layer 104 can act as cladding material for waveguides that are formed in silicon above the buried oxide layer 104. When used as a cladding, the buried oxide layer 104 can confine most of the light in a waveguide to remain in the waveguide, with a relatively small fraction of the waveguide light leaking into the cladding, and light intensity within the cladding typically following an exponential decay away from the interface between the cladding and the waveguide.

In some examples, the buried oxide layer 104 can be formed from silicon dioxide ($SiO_2$). In a wavelength range of 1.0 to 1.5 microns, silicon dioxide can have a refractive index of about 1.45, which is significantly less than the refractive index of silicon in this wavelength range (about 3.5), and is suitable for use as a cladding material. In some examples, the buried oxide layer 104 can have a thickness of 0.75 microns, 5 microns, a value between 0.75 microns and 5 microns, or another suitable value. Other oxide materials can also be used, including sapphire. Other wavelength values and ranges can also be used.

A silicon layer 106 can be disposed on the buried oxide layer 104. The silicon layer 106 can be etched to form waveguides and other optical components. In some examples, the silicon layer 106 can be formed from crystalline silicon. In some examples, the silicon layer 106 can be epitaxial, with a specified crystal orientation.

In a wavelength range of 1.0 to 1.5 microns, silicon can be essentially transparent (e.g., with relatively low absorption), with a refractive index of about 3.5. When etched into a suitably shaped waveguide, the silicon in the silicon layer 106 can be suitable for a core material. In some examples, the silicon layer 106 can have a thickness of 0.5 microns, between 0.3 microns and 0.7 microns, or another suitable value.

The silicon layer 106 can include one or more waveguides 108 in the silicon layer 106. The etched silicon layer 106 can form the waveguide core, with a refractive index of about 3.5 in the wavelength region of 1.0 to 1.5 microns. The oxide material 114 above the silicon layer 106 and below the silicon layer 106 (in the buried oxide layer 104) can form the waveguide cladding, with a refractive index of about 1.45 in the wavelength region of 1.0 to 1.5 microns.

In some examples, the waveguides 108 can be shaped as rib waveguides, which can confine a light beam in two dimensions orthogonal to a direction of propagation in the waveguide. In FIG. 1, the direction of propagation in the waveguide 108 is orthogonal to the plane of the page. In some examples, the optical waveguides can be rib waveguides that are sized to guide light, the guided light having a frequency corresponding to a first wavelength in air between 1.0 and 1.5 microns.

In some examples, the etched walls of the waveguides 108 are kept as close as possible to orthogonal to the plane of the substrate 102. In some examples, the etched walls are angled by between 80 degrees and 90 degrees, with respect to the plane of the substrate 102. In some examples, at least some of the waveguides 108 can have a width of 0.5 microns, 1 micron, 2 microns, a value between 0.3 microns and 3 microns. Other widths can also be used.

The etched silicon layer 106 can include etched vertical channels 110 extending through the silicon layer 106 to the buried oxide layer 104. These vertical channels 110 can aid with water diffusion, and may not have any appreciable effect on light propagating through the waveguides 108 in the etched silicon layer 106. In some examples, vertical channels 110 can have a width of 1 micron, 10 microns, or a value between 1 micron and 10 microns. Other widths can also be used.

In addition to, or instead of the vertical channels 110, the etched silicon layer 106 can include etched lateral channels 112 extending only partially into the silicon layer. These lateral channels 112 can also aid with water diffusion, and may not have any appreciable effect on light propagating through the waveguides 108 in the etched silicon layer 106. In some examples, the lateral channels 112 can be etched halfway through the etched silicon layer 106, although other depths can also be used. In some examples, the lateral channels 112 can be etched to the same depth as the waveguides 108. In other examples, the lateral channels 112 can be etched to a different depth than the waveguides 108.

An oxide material 114 can be disposed on the silicon layer 106. The oxide material 114 can extend into the vertical channels 110 and the lateral channels 112 in the silicon layer silicon layer 106. In some examples, the oxide material 114 can be the same material used in the buried oxide layer 104, such as silicon dioxide. Other oxide materials can also be used. The oxide material 114 can also fill in volumes above the waveguides 108, so that the oxide material 114 can form a cladding for the silicon core of the waveguides 108. In some examples, the oxide material 114 can be applied during manufacturing, then polished during manufacturing, to form a planarized oxide layer disposed on the silicon layer 106.

In most photonic integrated circuits, silicon can be used whenever possible, due to its high transparency (e.g., low loss), its ease in processing, and its relatively high mechanical strength. Silicon can be formed into waveguides relatively easily, using typical wafer-level lithographic processes. Silicon is not optically active (e.g., does not produce controllable gain or loss in response to a change in temperature and/or an applied electric field). For instances when optically active material is desired, III-V semiconductor material can be used.

A III-V semiconductor layer 116 can be disposed on the oxide material 114. In some examples, the III-V semiconductor layer 116 can be formed independently of the substrate 102, buried oxide layer 104, silicon layer 106, and oxide material 114, and placed in contact with the oxide material 114. In some examples, the III-V semiconductor layer 116 can be part of a fully-formed chip that is contacted with the oxide material 114. In some examples, the III-V semiconductor layer 116 can be formed from indium phosphide (InP). In other examples, the III-V semiconductor layer 116 can be formed from one or more of InP, GaAs, GaP, GaN, or InGaAs, or other suitable III-V semiconductor materials.

During manufacturing, water molecules 118 can be forced away from the interface between the III-V semiconductor layer 116 and the oxide material 114, which can enhance bonding between the III-V semiconductor layer 116 and the oxide material 114.

In some examples, at least some water molecules 118 present between the III-V semiconductor layer 116 and the oxide material 114 can be forced during manufacturing through the vertical channels 110 into the buried oxide layer 104 thereby to enhance bonding between the III-V semiconductor layer 116 and the oxide material 114. In some examples, due to this forcing during manufacturing, the buried oxide layer 104 can have a higher concentration of water molecules 118 than if such forcing were not used. This higher concentration of water molecules 118 may not degrade performance of the buried oxide layer 104, and beneficially can keep the water molecules 118 away from the interface between the III-V semiconductor layer 116 and the oxide material 114.

In some examples, at least some water molecules 118 present between the III-V semiconductor layer 116 and the oxide material 114 can be forced during manufacturing into the lateral channels 112, past the periphery of the III-V semiconductor layer 116, and, through diffusion, out of the oxide material 114 into an atmosphere surrounding the periphery of the III-V semiconductor layer 116 and adjacent the oxide material 114.

Figure 2:
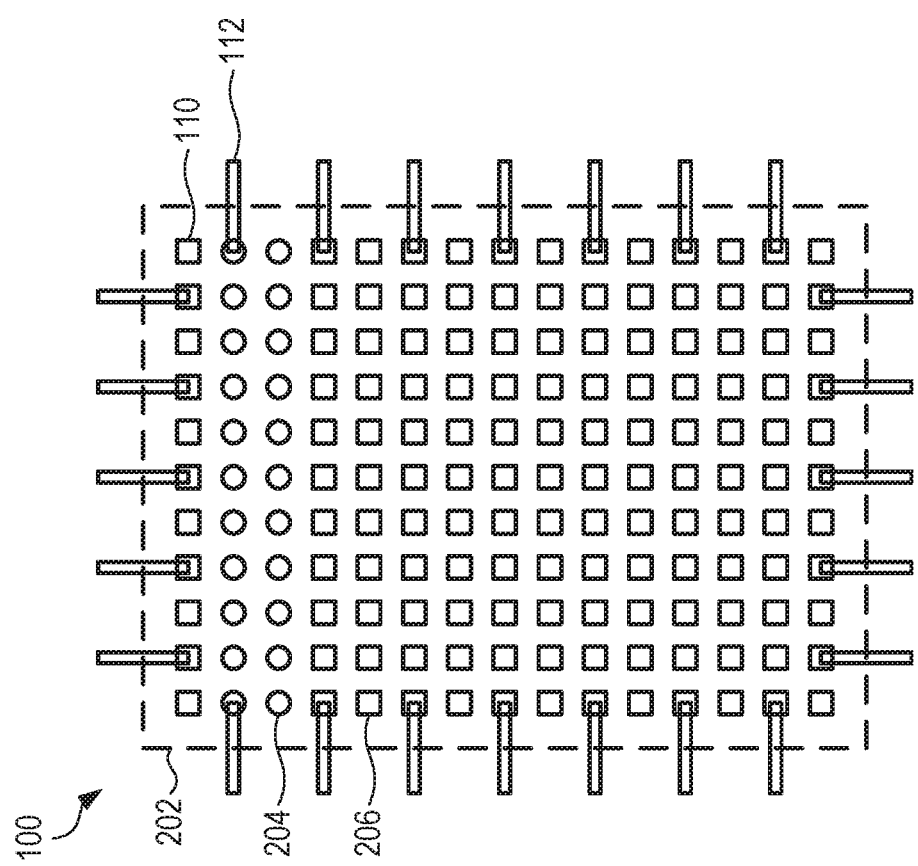
FIG. 2 shows a top view of selected elements of the integrated circuit of FIG. 1, in accordance with some embodiments.

FIG. 2 shows a top view of selected elements of the integrated circuit 100 of FIG. 1, in accordance with some embodiments.

Element 202 is a periphery of the III-V semiconductor layer 116. In the example of FIG. 2, the periphery 202 is rectangular, although other suitable shapes can be used. In some examples, the periphery 202 can be relatively irregular or jagged, corresponding to a specified design of the chip that includes the III-V semiconductor layer 116.

In some examples, the vertical channels 110 can extend through the silicon layer 106 to the buried oxide layer 104. In some examples, the vertical channels 110 can be positioned in a first repeating pattern across an area of the III-V semiconductor layer 116. In some examples, each vertical channel 110 can be spaced apart from an adjacent vertical channel 110 by 50 microns, 100 microns, 150 microns, or a value between 50 microns and 150 microns. Other suitable spacings can also be used. The vertical channels 110 can also be spaced irregularly around the area of the III-V semiconductor layer 116, such as to avoid placing a vertical channel 110 on a waveguide 108.

In some examples, the lateral channels 112 can extend laterally from an interior of a periphery 202 of the III-V semiconductor layer 116 to an exterior of the periphery of the III-V semiconductor layer 116. In some examples, the lateral channels 112 can be positioned in a second repeating pattern around the periphery 202 of the III-V semiconductor layer 116. In some examples, each lateral channel 112 can be spaced apart from an adjacent lateral channel 112 by between 100 microns and 150 microns, such as to avoid position conflicts between lateral channels 112 and waveguides 108. Other spacings can also be used. The lateral channels 112 can also be spaced irregularly around the periphery 202 of the III-V semiconductor layer 116.

In some examples, one or more of the vertical channels 204 can have a circular shape, when viewed from above as in FIG. 2. In some examples, one or more of the vertical channels 206 can have a square shape, when viewed from above as in FIG. 2. Other shapes can also be used. The shapes can vary from vertical channel 110 to vertical channel 110, as needed.

FIGS. 3-8 show side-view cross-sections of an example of various stages of preparation for the integrated circuit 100 of FIG. 1.

Figure 3:
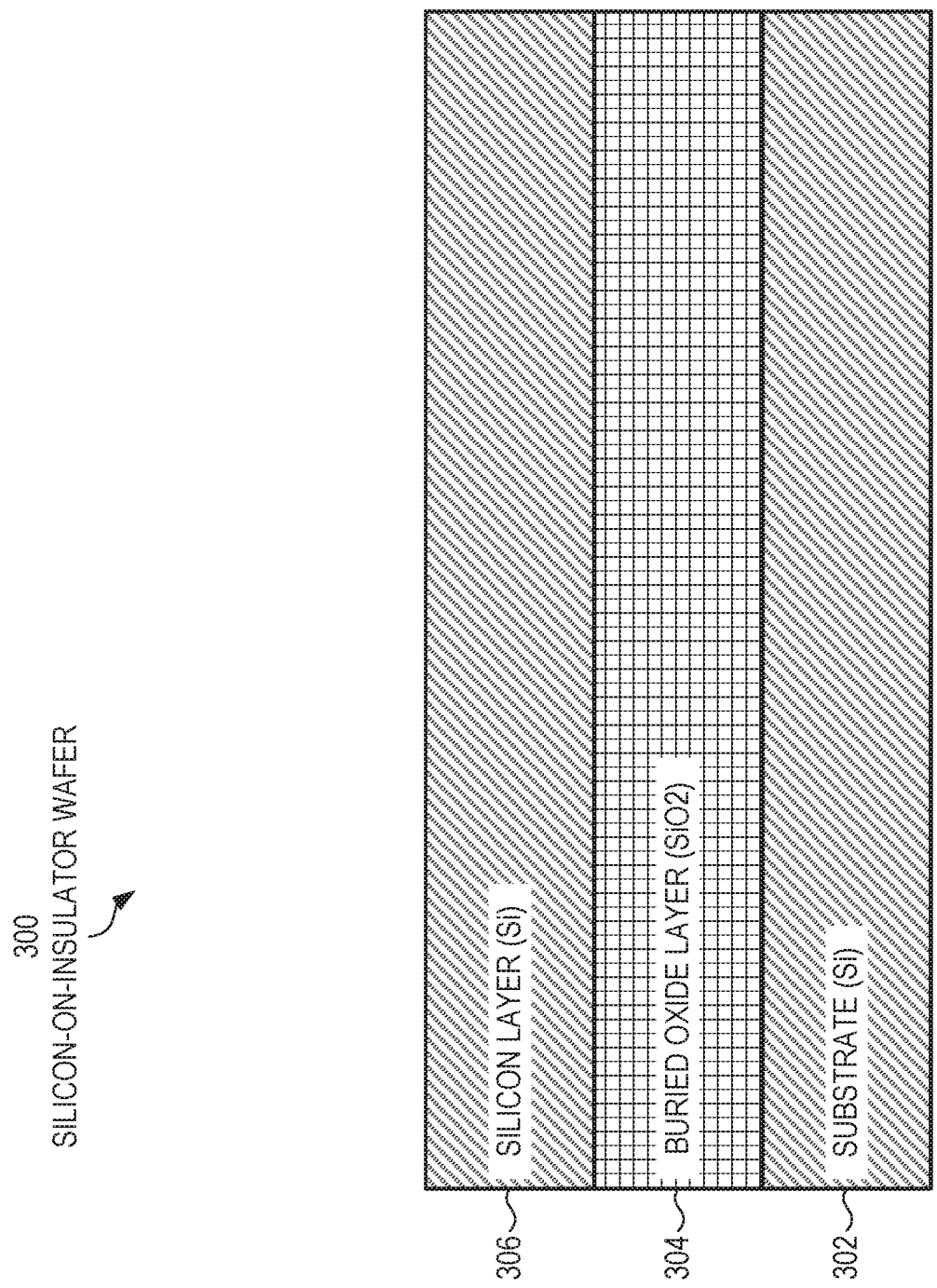
FIG. 3 shows an example of a silicon-on-insulator wafer, in accordance with some embodiments.

FIG. 3 shows an example of a silicon-on-insulator wafer 300, in accordance with some embodiments. The structure of FIG. 3 is but one example; other structures can also be used.

The silicon-on-insulator wafer 300 can include a substrate 302, a buried oxide layer 304 disposed on the substrate 302, and a silicon layer 306 disposed on the buried oxide layer 304. In this example, the silicon-on-insulator wafer 300 can be ordered from a wafer manufacturer, and provided as an integrated unit as starting material for subsequent processing.

Figure 4:
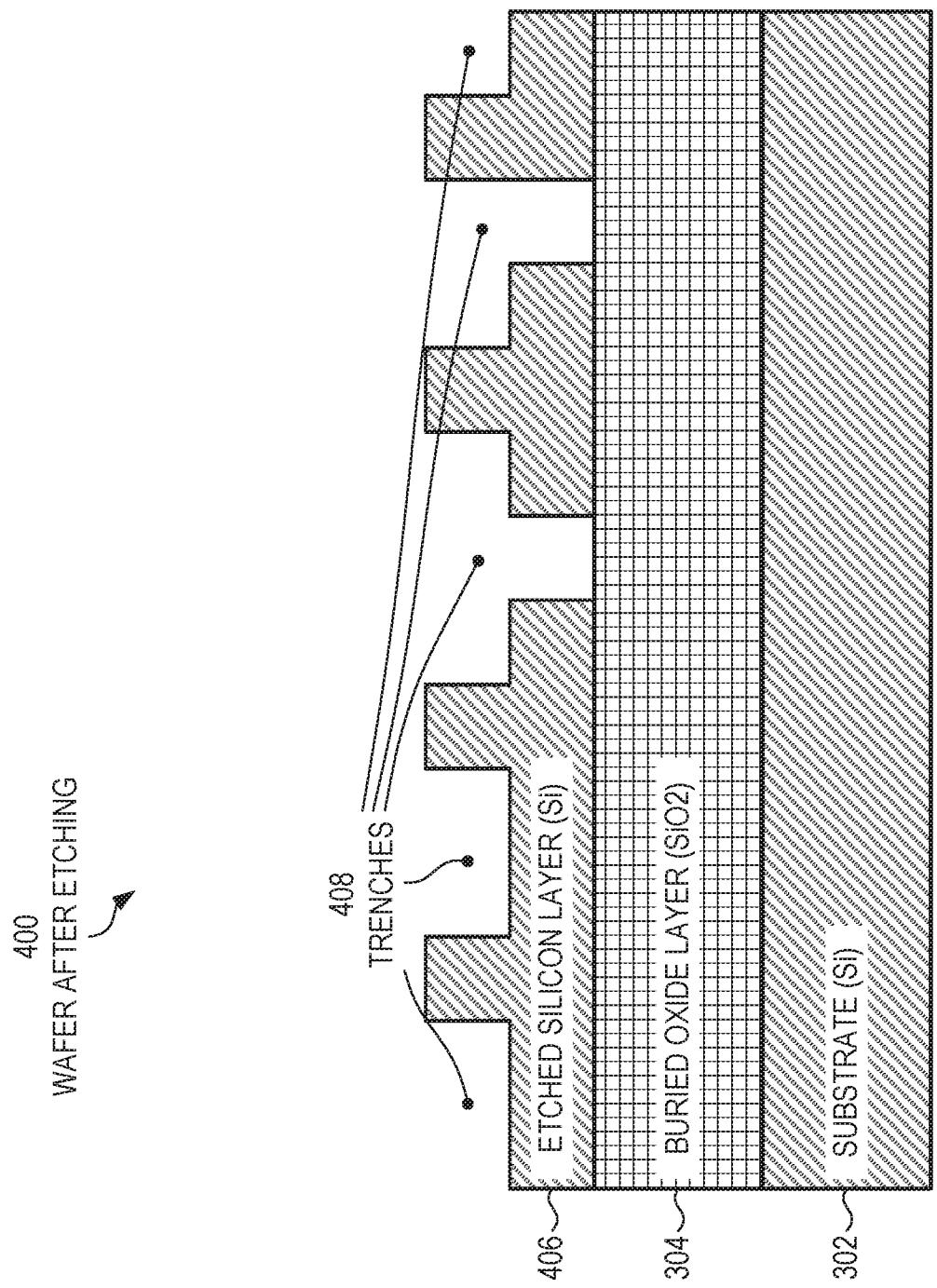
FIG. 4 shows an example of a silicon-on-insulator wafer, after the silicon-on-insulator wafer has been etched, in accordance with some embodiments.

FIG. 4 shows an example of a silicon-on-insulator wafer 400, after the silicon-on-insulator wafer 400 has been etched, in accordance with some embodiments. The structure of FIG. 4 is but one example; other structures can also be used.

In some examples, portions of the silicon layer 306 have been etched to form trenches 408 in an etched silicon layer 406. The trenches 408 corresponding to the fully etched portions, which extend fully to the buried oxide layer 304, will form the vertical channels when filled downstream with the oxide material. The trenches 408 corresponding to the partially etched portions, which extend only partially into the etched silicon layer 406, will form the waveguides and the lateral channels, when filled downstream with the oxide material.

Figure 5:
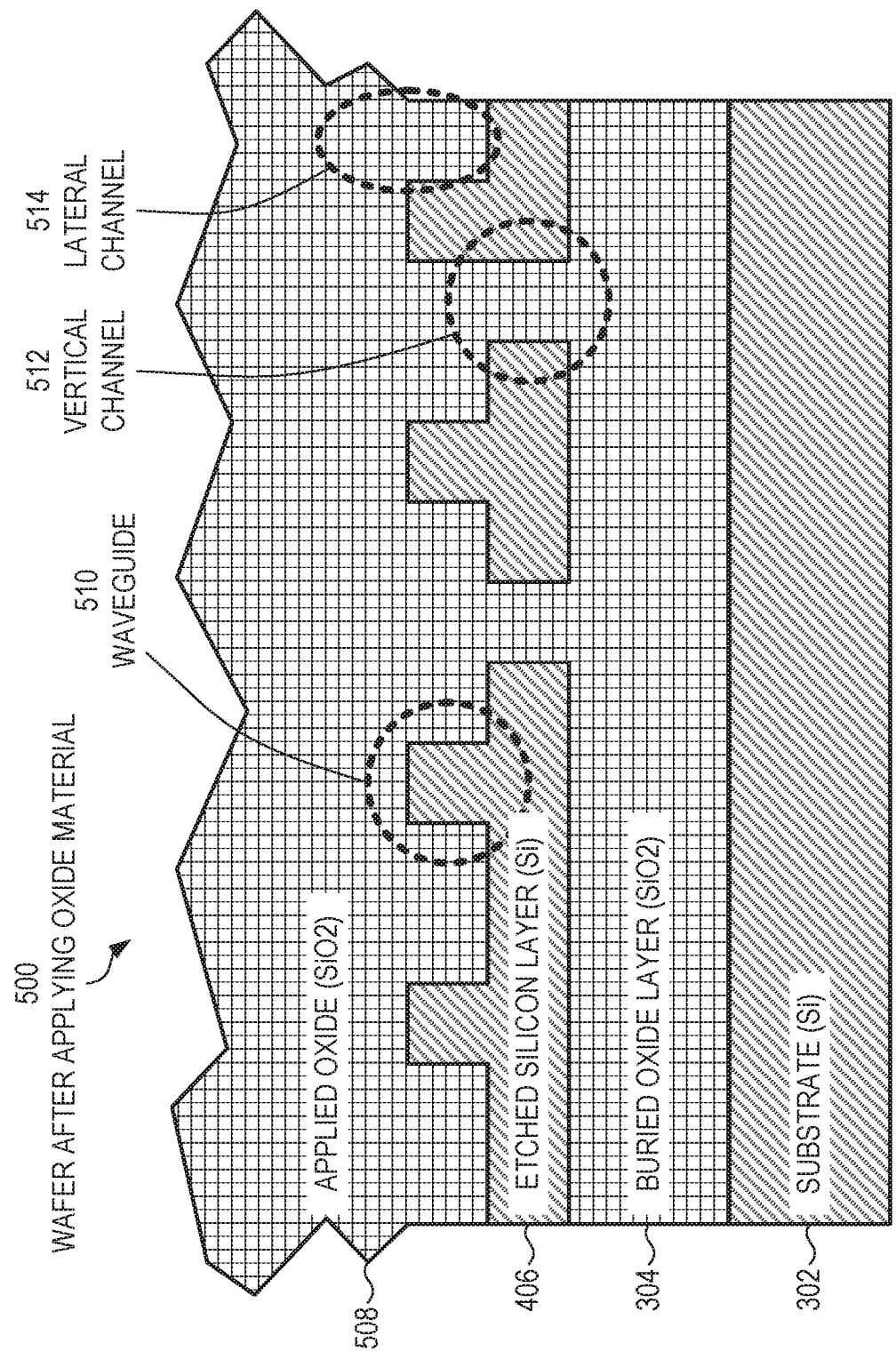
FIG. 5 shows an example of a silicon-on-insulator wafer, after the oxide material has been applied, in accordance with some embodiments.

FIG. 5 shows an example of a silicon-on-insulator wafer 500, after the oxide material has been applied, in accordance with some embodiments. The structure of FIG. 5 is but one example; other structures can also be used.

Oxide material 508 has been applied onto the etched silicon layer 406. The applied oxide material 508 can extend into and fill in the etched portions (trenches 408) of the etched silicon layer 406. In some examples, the applied oxide material 508 can be the same material used in the buried oxide layer 304. In some examples, the applied oxide material 508 can be silicon dioxide, although other materials can also be used, such as silicon nitride ($Si_3N_4$), silicon oxynitride ($SiO_xN_y$), or other dielectric films. Element 510 is a waveguide, having a silicon core formed from the etched silicon layer 406, and a silicon dioxide cladding, formed from the buried oxide layer 304 below the waveguide 510 and the applied oxide material 508 above the waveguide 510. Element 512 is a vertical channel. Element 514 is a lateral channel.

Figure 6:
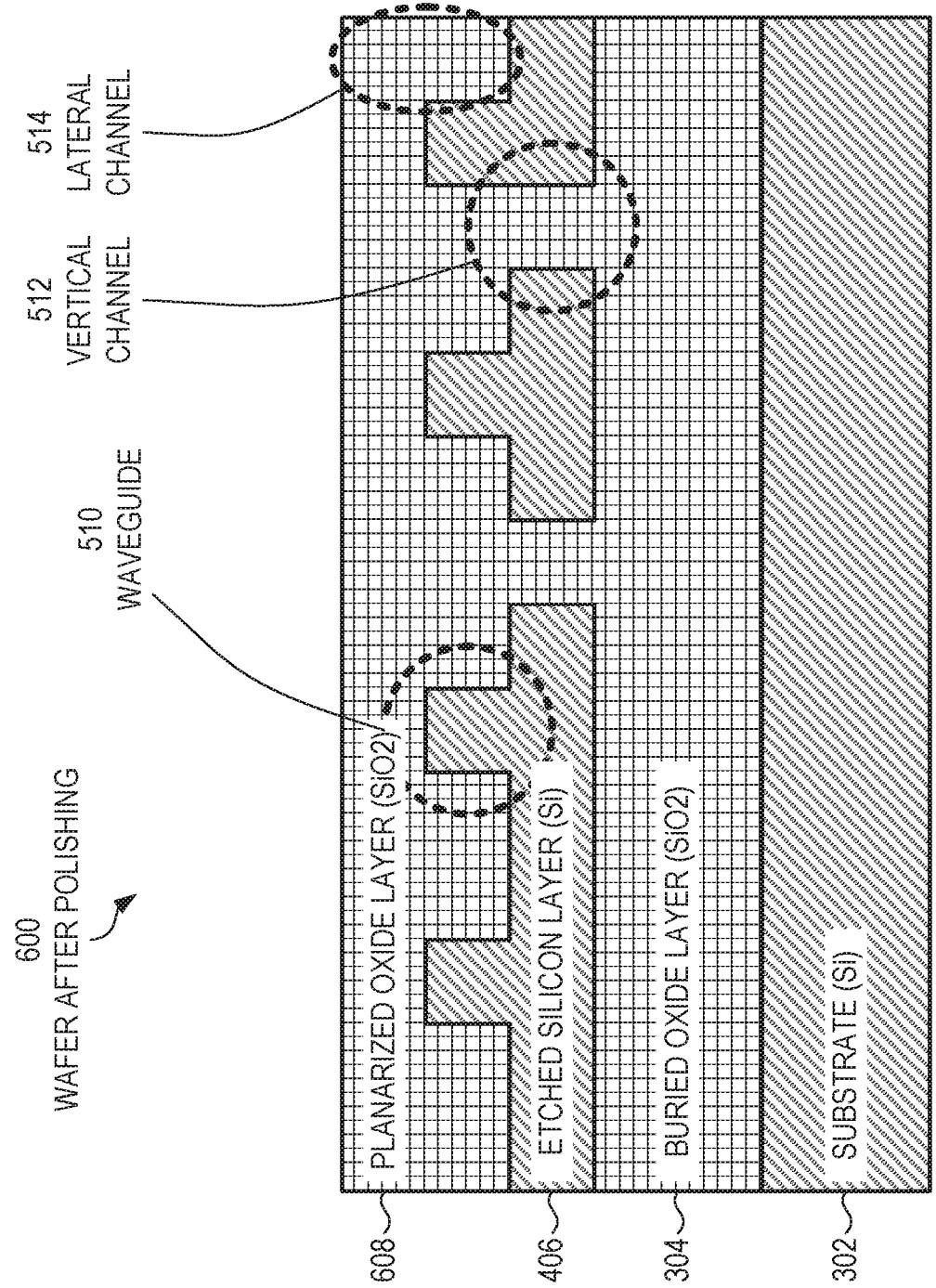
FIG. 6 shows an example of a wafer, after the applied oxide material has been polished to form a planarized oxide layer, in accordance with some embodiments.

FIG. 6 shows an example of a wafer 600, after the applied oxide material 508 has been polished to form a planarized oxide layer 608, in accordance with some embodiments. The structure of FIG. 6 is but one example; other structures can also be used.

In some examples, the planarized oxide layer 608 can have a thickness less than a wavelength of light guided by the waveguide 510. In some examples, the planarized oxide layer 608 can have a thickness of 50 nm, 75 nm, 100 nm, or a value between 50 nm and 100 nm. Other suitable thicknesses can also be used. Because the thickness of the planarized oxide layer 608 can be relatively small, compared to the wavelength of the guided light, a significant fraction of the guided light can be present in the planarized oxide layer 608, which can allow relatively efficient coupling between the waveguide 510 and other elements that can be placed in contact with the top of the planarized oxide layer 608.

Figure 7:
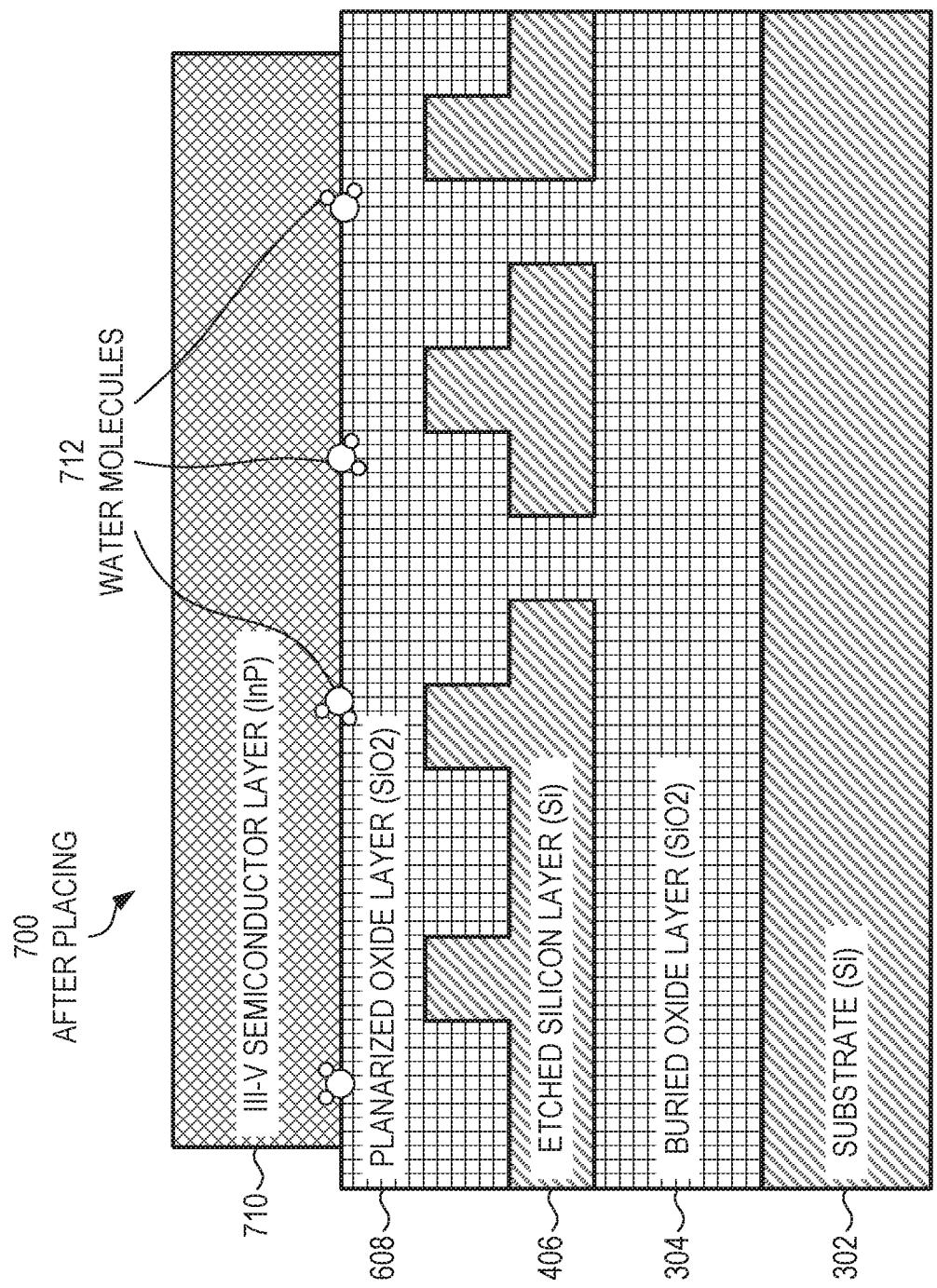
FIG. 7 shows an example of a device, after a III-V semiconductor layer has been placed in contact with the planarized oxide layer, in accordance with some embodiments.

FIG. 7 shows an example of a device 700, after a III-V semiconductor layer 710 has been placed in contact with the planarized oxide layer 608, in accordance with some embodiments. In some examples, the III-V semiconductor layer 710 can be in the form of a die, such as a rectangular piece of III-V semiconductor material. In some examples, the III-V semiconductor layer 710 can include a multi-layer stack of different III-V semiconductor materials, such as to form a diode with p- and n-doped semiconducting layers, or another suitable structure having a particular electrical function. The structure of FIG. 7 is but one example; other structures can also be used.

In practice, the III-V semiconductor layer 710 and the planarized oxide layer 608 may attract water molecules 712 through condensation on the layer surfaces. Such condensation is difficult to avoid, in the absence of a tightly controlled (and thereby expensive) environment. Because the layer surfaces may contain some condensation, placing the III-V semiconductor layer 710 in contact with the planarized oxide layer 608 can trap one or more water molecules 712 at the interface between the III-V semiconductor layer 710 and the planarized oxide layer 608. These trapped water molecules 712 can lead to a failure at the interface, which could involve peel or separating of the planarized oxide layer 608 from the III-V semiconductor layer 710.

Because water molecules can diffuse readily through oxide material, forcing the III-V semiconductor layer 710 against the planarized oxide layer 608 can force the water molecules 712 at the interface into the planarized oxide layer 608 and away from the interface.

Figure 8:
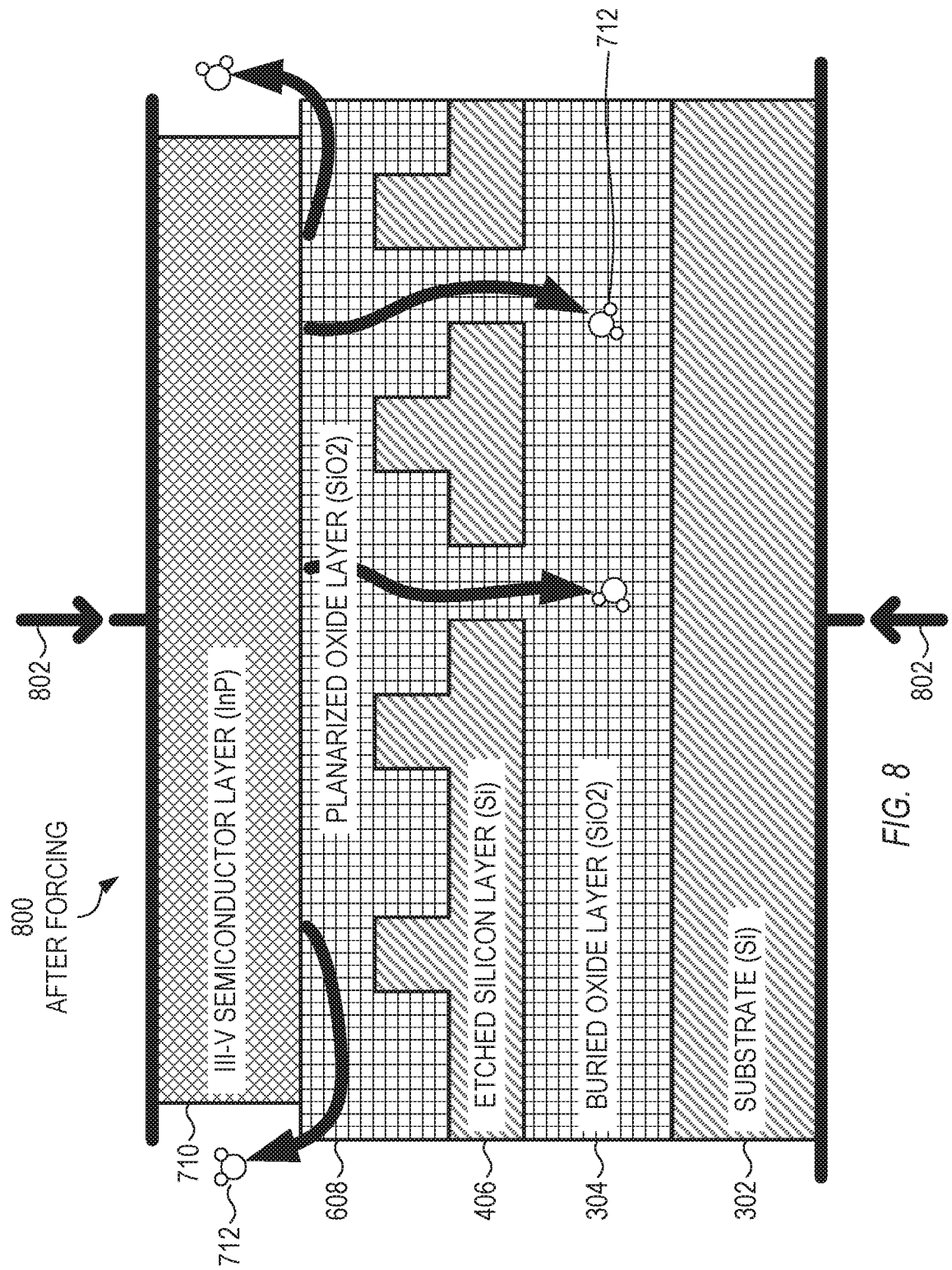
FIG. 8 shows an example of a device, after the III-V semiconductor layer has been forced against the planarized oxide layer, in accordance with some embodiments.

FIG. 8 shows an example of a device 700, after the III-V semiconductor layer 710 has been forced against the planarized oxide layer 608, in accordance with some embodiments. The water molecules 712 present at the interface between the III-V semiconductor layer 710 and the planarized oxide layer 608 have been forced into the planarized oxide layer 608 and away from the interface. The structure of FIG. 8 is but one example; other structures can also be used.

The force 802 is shown in FIG. 8 as being applied to compress the substrate 302 against the III-V semiconductor layer 710. It will be understood that this is but one way to impart the force that relocates the trapped water molecules 712, other suitable ways can also be used. For example, the substrate 302 can remain stationary, and a force can be applied to the III-V semiconductor layer 710. Alternatively, the III-V semiconductor layer 710 can remain stationary, and a force can be applied to the substrate 302. As a further alternative, both the III-V semiconductor layer 710 and the substrate 302 can be forced against each other.

In some examples, the III-V semiconductor layer 710 can be forced against the planarized oxide layer 608 at ambient pressure and at a temperature greater than room temperature. In other examples, the III-V semiconductor layer 710 can be forced against the planarized oxide layer 608 in a vacuum and at a temperature greater than room temperature.

After the water molecules have been forced away from the interface, there can be subsequent wafer-level processing of the III-V semiconductor layer 710 and/or the silicon-on-insulator wafer, including dicing into individual components.

Figure 9:
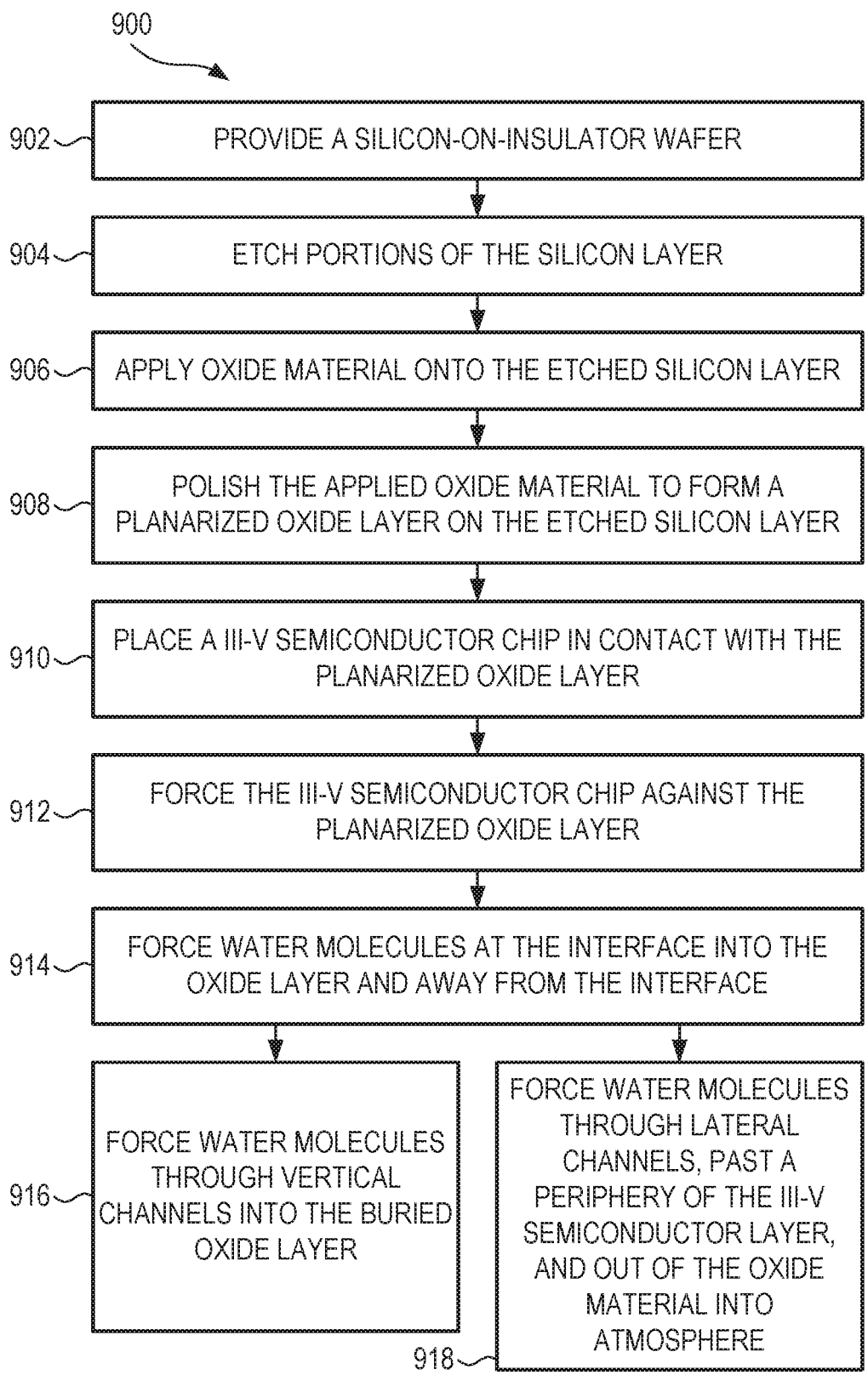
FIG. 9 shows a flowchart of an example of a method for manufacturing an integrated circuit, in accordance with some embodiments.

FIG. 9 shows a flowchart of an example of a method 900 for manufacturing an integrated circuit, in accordance with some embodiments. The method 900 is suitable for manufacturing the integrated circuit 100 of FIG. 1, among other devices. The method 900 is but one method for manufacturing an integrated circuit; other suitable methods can also be used.

At operation 902, a silicon-on-insulator wafer is provided. The silicon-on-insulator wafer can include a substrate, a buried oxide layer disposed on the substrate, and a silicon layer disposed on the buried oxide layer.

At operation 904, portions of the silicon layer can be etched to create vertical channels extending through the silicon layer to the buried oxide layer.

At operation 906, an oxide material can be applied onto the silicon layer. The applied oxide material can extend into the vertical channels in the silicon layer.

At optional operation 908, the oxide material can be polished to form a planarized oxide layer on the silicon layer.

At operation 910, a III-V semiconductor layer can be placed in contact with the oxide material, optionally in contact with the planarized oxide layer. In some examples, the III-V semiconductor layer can be placed in contact with the oxide material layer at room temperature.

At operation 912, the III-V semiconductor layer can be forced against the oxide material (optionally against the planarized oxide layer).

At operation 914, the water molecules present at an interface between the III-V semiconductor layer and the oxide material can be forced into the oxide layer and away from the interface.

At operation 916, the water molecules can be forced through the vertical channels into the buried oxide layer thereby to enhance bonding between the III-V semiconductor layer and the oxide material.

At operation 918, the water molecules can be forced through lateral channels, past a periphery of the III-V semiconductor layer, and, through diffusion, out of the oxide material into an atmosphere surrounding the periphery of the III-V semiconductor layer and adjacent the oxide material.

In some examples, one of operations 916 and 918 can be performed but not the other. In other examples, both can be performed.

In some examples, the III-V semiconductor layer can be forced against the oxide material at ambient pressure and at a temperature greater than room temperature. In some examples, the III-V semiconductor layer can be forced against the oxide material in a vacuum and at a temperature greater than room temperature.

In some examples, the method 900 can optionally further include, prior to applying the oxide material, partially etching portions of the silicon layer to create lateral channels in the silicon layer, the lateral channels positioned such that when the III-V semiconductor layer is placed in contact with the oxide material, the lateral channels extend laterally from an interior of a periphery of the III-V semiconductor layer to an exterior of the periphery of the III-V semiconductor layer. When the III-V semiconductor layer is forced against the oxide material, at least some of the water molecules present at the interface between the III-V semiconductor layer and the oxide material are forced into the lateral channels, past the periphery of the III-V semiconductor layer, and, through diffusion, out of the oxide material into an atmosphere surrounding the periphery of the III-V semiconductor layer and adjacent the oxide material.

In some examples, when the III-V semiconductor layer is placed in contact with the oxide material, the vertical channels can be positioned in a first repeating pattern across an area of the III-V semiconductor layer, and the lateral channels can be positioned in a second repeating pattern around the periphery of the III-V semiconductor layer.

In some examples, at least some of the vertical channels can intersect at least some of the lateral channels.

In some examples, the method 900 can optionally further include, prior to applying the oxide material, partially etching portions of the silicon layer to create waveguides in the silicon layer.

In some examples, the silicon layer can be etched to a first depth to form the lateral channels, and the silicon layer can be etched to a second depth, different from the first depth, to form waveguides in the silicon layer.

In some examples, the silicon layer can be etched to a first depth to form the lateral channels and the waveguides in the silicon layer.

After the water molecules have been forced away from the interface, there can be subsequent wafer-level processing of the III-V semiconductor chip and/or the silicon-on-insulator wafer, including dicing into individual components.

The devices, systems, and methods discussed above rely on wafer-level processes for manufacturing and alignment. Most or all optical elements are formed through mature processes that have been developed for semiconductor manufacturing, such as photolithography and etching. For example, current photolithography techniques can routinely provide feature sizes down to 45 nm, over a 300 mm-diameter silicon wafer.

Compared to more traditional optical systems, in which components are manufactured discretely and aligned to one another, the wafer-level approach offers a significant benefit of scalability. It may be relatively expensive to own or buy time on a photolithography machine, but the expense is easily recovered by the economy of scale. A single wafer can produce thousands of parts. In addition, the parts themselves can include components that are aligned to one another through the lithographic process, which can avoid costly and tedious manual alignment of components to one another. In addition, the optical system can be packaged as an application-specific integrated circuit (ASIC), and integrated into switching systems alongside other purely electrical ASICs. Along with the convenience in packaging as an ASIC, the optical system can achieve the reliability of an ASIC, with single-chip and solid-state devices that are more reliable than comparable systems formed from discrete components.

Figure 10:
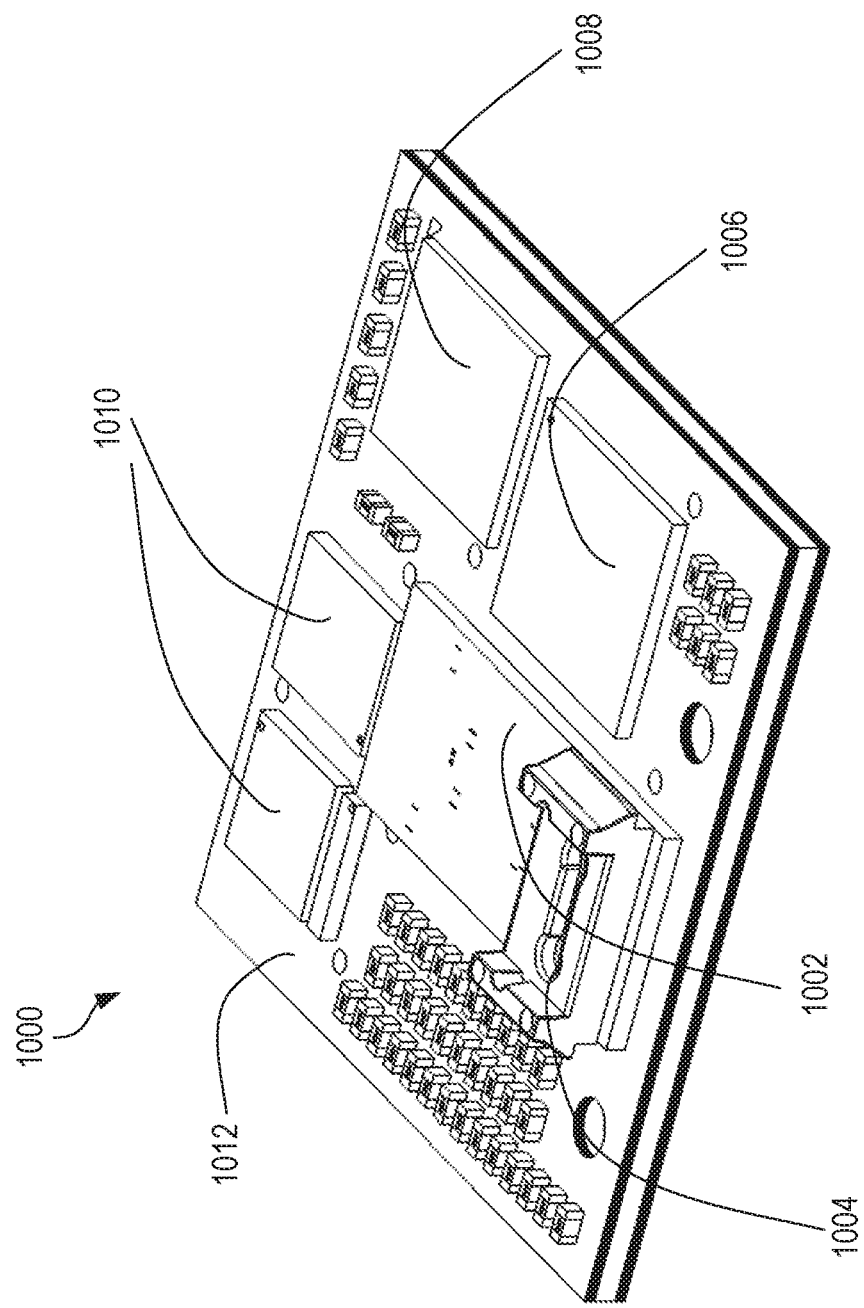
FIG. 10 shows an example of an optical transceiver, in accordance with some embodiments.

FIG. 10 shows an example of an optical transceiver 1000, in accordance with some embodiments. The optical transceiver 1000 can send and receive optical signals (e.g., optical beams upon which data is encoded). The optical transceiver 1000 is suitable for use in data center servers, optical ethernet, and other applications. For example, in a cloud data center network, the optical transceiver 1000 can be used for spine-spine servers, spine-leaf servers, and leaf-ToR (top of rack) servers. The optical transceiver 1000 can be used in other suitable applications as well.

The optical transceiver 1000 can include a photonic integrated circuit (PIC) 1002, which can perform any combination of producing light, detecting light, modulating light, demodulating light, amplifying light, attenuating light, separating multi-wavelength light into light at individual wavelengths, combining light at individual wavelengths into multi-wavelength light, and other suitable optical functions.

Waveguides can transport light into and out of the photonic integrated circuit 1002, and can transport light from element to element within the photonic integrated circuit 1002. The waveguides can include a core material with a relatively high refractive index, such as silicon, surrounded by a cladding material with a relatively low refractive index, such as silicon dioxide. Both silicon and silicon dioxide are transparent at infrared wavelengths, such as between 1 micron and 1.5 microns. In some examples, the waveguides can be formed in layers on a substrate, such as providing a substrate having a silicon layer on a buried oxide layer, etching trenches in the silicon layer, filling in the trenches with additional oxide material, and polishing the additional oxide material of the filled-in trenches to a desired cladding thickness on a top of the waveguide. In some examples, the waveguides can be shaped as rib waveguides, which can confine a light beam in two dimensions orthogonal to a direction of propagation in the waveguide, and can maintain a constant cross-section along the direction of propagation. In some examples, the rib waveguides can have a trapezoidal cross-section, with parallel top and bottom surfaces (e.g., the surfaces facing toward and away from the substrate on which the waveguides are formed), and angled side surfaces. In some examples, the angle can be 90 degrees, so that the waveguide has a rectangular cross-section. In other examples, the angles can be close to 90 degrees, such as between 80 degrees and 90 degrees, due to limitations in a lithographic exposing or etching process.

While some waveguides are intended to transport light from location to location in a photonic integrated circuit, other waveguides can intentionally impart a gain or a loss to the light that passes through the waveguides. For example, a waveguide can include an active portion, in which the inactive silicon material can be replaced with an optically active material, such as indium phosphide.

Some waveguides can be formed with different material than the silicon core and the silicon dioxide cladding. For example, one or more of the waveguides can replace some of the silicon core, which is optically inactive, with an active material, such as indium phosphide. By electrically biasing the active material, light passing through the active material can be selectively amplified or absorbed. In general, indium phosphide can be used only where optically active material is needed, because it is less transparent, more expensive, and more fragile than silicon. The active material can also be placed in the waveguide at the wafer level, using common techniques from the semiconductor industry.

In some examples, it may be desirable to couple light from one waveguide to another waveguide. For example, it may be desirable to couple light from an inactive waveguide to a separate active waveguide that includes an active portion, then back to the inactive waveguide. For these cases, it may be convenient to position the active waveguide in a separate layer on top of the inactive waveguide. Coupling between the waveguides can be achieved by suitably tapering a width of one or both of the waveguides. Such a configuration can be convenient for locating electrodes on opposite sides of the active portion, so that the electrodes can be positioned in the same layer as the active material.

In some examples, active material can be used as attenuating material to form an electro-absorption modulator, which can electrically bias the active material to attenuate light at prescribed times. The electro-absorption modulator can impart a slowly-varying attenuation onto a light beam, and/or can impart a data signal onto a light beam. Alternatively, when the active material is used to impart gain onto light in the active waveguide, the inactive waveguides can include reflectors on either side of the active waveguide to form a laser cavity. In some examples, such a laser cavity need not be actively cooled, which can reduce power requirements and simplify the overall design of the photonic integrated circuit. In some examples, output light can be coupled out of the laser cavity through a vertical coupler (e.g., toward or away from the substrate on which the laser is formed). Such vertical coupling can be beneficial in that the laser need not have an active facet from which the laser light emerges. Because active facets can be prone to heat-induced failure, omitting the active facet can help improve the reliability and lifetime of the laser.

In some examples, waveguides can be used to form spectral filters, which can transmit light at one or more prescribed wavelengths, and attenuate light away from the prescribed wavelength or wavelengths. For example, a Fabry-Perot filter can be formed as a section of a waveguide, the section being bounded by two reflectors in the waveguide. The Fabry-Perot filter is transmissive at wavelengths for which the round-trip optical path length between the reflectors equals an integral number of wavelengths, and attenuating for wavelengths away from the transmissive wavelengths. As another example, a ring resonator can be formed adjacent to a first waveguide. When a round-trip optical path length around the ring resonator equals an integral number of wavelengths, light in the first waveguide can couple into the ring resonator, and can couple out of the ring resonator into a second waveguide adjacent to the ring resonator. Such a ring resonator exhibits peaked wavelengths, at which there is enhanced coupling into and out of the ring resonator, and minimal coupling away from those peaked wavelengths.

Although these spectral filters can function in a passive manner, they are typically more useful if they can be actively controlled. For example, a portion of the waveguide between the Fabry-Perot reflectors, or within the ring resonator, can include an optically active material, which can vary in refractive index as a function of temperature. A heater positioned adjacent the optically active material can control a temperature of the active material, can therefore control an optical path length within the spectral filter, and can therefore control the wavelength (or wavelengths) at which the spectral filter is transmissive. In some examples, the active material can be positioned in a separate layer on top of the inactive waveguide. Coupling between the waveguides can be achieved by suitably tapering a width of one or both of the waveguides. Such a configuration can be convenient for locating a heater adjacent to the active material, so that the heater can be positioned in the same layer as the active material.

A Mach-Zehnder interferometer can use the heater and variable refractive index material to form an efficient beam attenuator or modulator. A Mach-Zehnder interferometer can split an incident beam into two beams, vary an optical path length of one of the beams, then interfere the two beams to produce an output beam. The Mach-Zehnder interferometer is transmissive at wavelengths for which the optical path difference between the two arms equals an integral number of wavelengths, and attenuating (to varying degrees) at wavelengths between the transmissive wavelengths. Mach-Zehnder interferometers can function as efficient attenuators or modulators, because the optical path difference required to swing from fully transmissive to fully attenuating is half of a wavelength.

One or more of a Fabry-Perot cavity, a ring resonator, and/or a Mach-Zehnder interferometer can be combined to form a multiplexer, which can combine two or more input beams at different wavelengths into a single output beam having multiple wavelengths. Similarly, these elements can also be combined to form a demultiplexer, which can separate a single input beam having multiple wavelengths into two or more output beams at different wavelengths. The multiplexer and demultiplexer can operate with light having a data signal (e.g., modulated at a particular data rate), or with relatively slowly-varying light that lacks a data signal.

A photonic integrated circuit 1002 can optionally include one or more photodetectors, which can produce an electrical signal in response to a level of sensed light in a waveguide. The electrical signal can be processed by a processor located on the photonic integrated circuit 1002, on the optical transceiver 1000 away from the photonic integrated circuit 1002, or away from the optical transceiver 1000.

A photonic integrated circuit 1002 can optionally include one or more fiber couplers, which can couple light vertically (e.g., toward or away from the substrate on which the photonic integrated circuit 1002 is formed) into or out of the photonic integrated circuit 1002. In some examples, the fiber coupler can include a relatively precise mechanical housing, such as an optical interface platform 1004, so that the mechanical housing can determine the position and direction of the fiber when the fiber attaches to the housing. Such a precise housing can allow passive coupling to the fiber (as opposed to active coupling, in which a position and/or direction of the fiber is actively adjusted to optimize a coupling efficiency). In some examples, the optical interface platform 1004 can include a rematable fiber interface that can simultaneously attach or detach up to eight fibers, although other values can also be used.

The photonic integrated circuit 1002 can arrange the optical components described above to form a number of devices.

For example, the photonic integrated circuit 1002 can be configured as a local area network wavelength division multiplexer (LAN-WDM) or a coarse wavelength division multiplexer (CWDM). The photonic integrated circuit 1002 can include a first laser to emit first light at a first wavelength, a first modulator to impart a first data signal onto the first light, a second laser to emit second light at a second wavelength, a second modulator to impart a second data signal onto the second light, a multiplexer to combine the modulated first and second lights into output light, and a first coupler to couple the output light out of the photonic integrated circuit 1002 into an optical fiber. The photonic integrated circuit 1002 can include additional lasers and modulators at additional wavelengths, as needed. As standardized data rates increase over time, the modulators can be run at faster rates, so that the same platform can be used with successive generations of the photonic integrated circuit 1002. Similarly, as channel counts increase over time (e.g., the number of wavelengths present in the output light), the number of additional lasers and modulators at additional wavelengths can be increased, as needed.

As another example, the photonic integrated circuit 1002 can be configured to operate in parallel single mode. The photonic integrated circuit 1002 can include a first laser to emit first light at a first wavelength, a first modulator to impart a first data signal onto the first light, a first coupler to couple the modulated first light out of the photonic integrated circuit 1002 into a first optical fiber, a second laser to emit second light at a second wavelength, a second modulator to impart a second data signal onto the second light, and a second coupler to couple the modulated second light out of the photonic integrated circuit 1002 into a second optical fiber. The photonic integrated circuit 1002 can include additional lasers, modulators, and couplers at additional wavelengths, as needed.

The optical transceiver 1000 can include a control ASIC 1006, which can control the photonic integrated circuit 1002. The control ASIC 1006 can optionally accommodate both electrical and optical signals.

The optical transceiver 1000 can include a microcontroller 1008, which can control which chips communicate with each other. In some examples, the microcontroller 1008 can include an I-squared-C management interface, which is a synchronous, multi-master, multi-slave, packet switched, single-ended, serial computer bus. Other interfaces can also be used.

The optical transceiver 1000 can include a chipset 1010, which can correspond to a number of data channels and a data rate. In some examples, the chipset 1010 can have integrated retimers.

The optical transceiver 1000 can include a substrate 1012, which mechanically supports all the elements of the optical transceiver 1000. In some examples, the substrate 1012 can conform to a standardized size and configuration, such as a 14 mm by 14 mm ball grid array configuration. Other configurations can also be used.

In the foregoing detailed description, the method and apparatus of the present disclosure have been described with reference to specific embodiments thereof. It will, however, be evident that various modifications and changes may be made thereto without departing from the broader spirit and scope of the present disclosure. The present specification and figures are accordingly to be regarded as illustrative rather than restrictive.

To further illustrate the device and related method disclosed herein, a non-limiting list of examples is provided below. Each of the following non-limiting examples can stand on its own, or can be combined in any permutation or combination with any one or more of the other examples.

In Example 1, an integrated circuit can include: a substrate; a buried oxide layer disposed on the substrate; a silicon layer disposed on the buried oxide layer, the silicon layer including etched vertical channels extending through the silicon layer to the buried oxide layer; an oxide material disposed on the silicon layer, the oxide material extending into the vertical channels in the silicon layer; and a III-V semiconductor layer disposed on the oxide material, wherein water molecules present between the III-V semiconductor layer and the oxide material are forced during manufacturing through the vertical channels into the buried oxide layer thereby to enhance bonding between the III-V semiconductor layer and the oxide material.

In Example 2, the integrated circuit of Example 1 can optionally be configured such that the silicon layer further includes etched lateral channels extending only partially into the silicon layer, the oxide material extending into the lateral channels in the silicon layer, the lateral channels extending laterally from an interior of a periphery of the III-V semiconductor layer to an exterior of the periphery of the III-V semiconductor layer.

In Example 3, the integrated circuit of any one of Examples 1-2 can optionally be configured such that the vertical channels are positioned in a first repeating pattern across an area of the III-V semiconductor layer; and the lateral channels are positioned in a second repeating pattern around the periphery of the III-V semiconductor layer.

In Example 4, the integrated circuit of any one of Examples 1-3 can optionally be configured such that at least some of the vertical channels intersect at least some of the lateral channels.

In Example 5, the integrated circuit of any one of Examples 1-4 can optionally be configured such that the oxide material is applied during manufacturing, then polished during manufacturing, to form a planarized oxide layer disposed on the silicon layer.

In Example 6, the integrated circuit of any one of Examples 1-5 can optionally be configured such that the III-V semiconductor layer is included on a III-V semiconductor chip; and during manufacturing, the III-V semiconductor chip is forced against the planarized oxide layer to force the water molecules through the vertical channels into the buried oxide layer.

In Example 7, the integrated circuit of any one of Examples 1-6 can optionally be configured such that during manufacturing: the silicon layer is etched to a first depth to form the lateral channels; and the silicon layer is etched to a second depth, different from the first depth, to form waveguides in the silicon layer.

In Example 8, the integrated circuit of any one of Examples 1-7 can optionally be configured such that during manufacturing: the silicon layer is etched to a first depth to form the lateral channels and to form waveguides in the silicon layer.

In Example 9, the integrated circuit of any one of Examples 1-8 can optionally be configured such that the substrate is formed from silicon (Si); the buried oxide layer is formed from silicon dioxide ($SiO_2$); the oxide material is silicon dioxide; and the III-V semiconductor layer is formed from indium phosphide (InP).

In Example 10, a method of manufacturing an integrated circuit can include: providing a silicon-on-insulator wafer including a substrate, a buried oxide layer disposed on the substrate, and a silicon layer disposed on the buried oxide layer; etching portions of the silicon layer to create vertical channels extending through the silicon layer to the buried oxide layer; applying an oxide material onto the silicon layer, the applied oxide material extending into the vertical channels in the silicon layer; placing a III-V semiconductor layer in contact with the oxide material; and forcing the III-V semiconductor layer against the oxide material to force water molecules present at an interface between the III-V semiconductor layer and the oxide material through the vertical channels into the buried oxide layer thereby to enhance bonding between the III-V semiconductor layer and the oxide material.

In Example 11, the method of Example 10 can optionally further include, prior to applying the oxide material: partially etching portions of the silicon layer to create lateral channels in the silicon layer, the lateral channels positioned such that when the III-V semiconductor layer is placed in contact with the oxide material, the lateral channels extend laterally from an interior of a periphery of the III-V semiconductor layer to an exterior of the periphery of the III-V semiconductor layer, wherein when the III-V semiconductor layer is forced against the oxide material, at least some of the water molecules present at the interface between the III-V semiconductor layer and the oxide material are forced into the lateral channels, past the periphery of the III-V semiconductor layer, and, through diffusion, out of the oxide material into an atmosphere surrounding the periphery of the III-V semiconductor layer and adjacent the oxide material.

In Example 12, the method of any one of Examples 10-11 can optionally be configured such that when the III-V semiconductor layer is placed in contact with the oxide material: the vertical channels are positioned in a first repeating pattern across an area of the III-V semiconductor layer; and the lateral channels are positioned in a second repeating pattern around the periphery of the III-V semiconductor layer.

In Example 13, the method of any one of Examples 10-12 can optionally be configured such that at least some of the vertical channels intersect at least some of the lateral channels.

In Example 14, the method of any one of Examples 10-13 can optionally further include, prior to applying the oxide material: partially etching portions of the silicon layer to create waveguides in the silicon layer.

In Example 15, the method of any one of Examples 10-14 can optionally be configured such that the silicon layer is etched to a first depth to form the lateral channels; and the silicon layer is etched to a second depth, different from the first depth, to form waveguides in the silicon layer.

In Example 16, the method of any one of Examples 10-15 can optionally be configured such that the silicon layer is etched to a first depth to form the lateral channels and the waveguides in the silicon layer.

In Example 17, the method of any one of Examples 10-16 can optionally further include, after applying the oxide material and prior to placing the III-V semiconductor layer in contact with the oxide material: polishing the oxide material to form a planarized oxide layer disposed on the silicon layer, wherein the III-V semiconductor layer is placed in contact with the planarized oxide layer.

In Example 18, the method of any one of Examples 10-17 can optionally be configured such that the III-V semiconductor layer is placed in contact with the oxide material layer at room temperature; and the III-V semiconductor layer is forced against the oxide material at ambient pressure and at a temperature greater than room temperature.

In Example 19, the method of any one of Examples 10-18 can optionally be configured such that the III-V semiconductor layer is placed in contact with the oxide material layer at room temperature; and the III-V semiconductor layer is forced against the oxide material in a vacuum and at a temperature greater than room temperature. In Example 20, an integrated circuit can include: a substrate; a buried oxide layer disposed on the substrate; a silicon layer disposed on the buried oxide layer, the silicon layer including etched vertical channels extending through the silicon layer to the buried oxide layer, the silicon layer including etched lateral channels extending only partially into the silicon layer; a planarized oxide layer disposed on the silicon layer, the planarized oxide layer formed from an oxide material that extends into the vertical channels and the lateral channels in the silicon layer; and a III-V semiconductor layer disposed on the oxide material, the lateral channels extending laterally from an interior of a periphery of the III-V semiconductor layer to an exterior of the periphery of the III-V semiconductor layer, the vertical channels being positioned in a first repeating pattern across an area of the III-V semiconductor layer, the lateral channels being positioned in a second repeating pattern around the periphery of the III-V semiconductor layer, wherein at least some water molecules present between the III-V semiconductor layer and the oxide material are forced during manufacturing through the vertical channels into the buried oxide layer thereby to enhance bonding between the III-V semiconductor layer and the oxide material, and wherein at least some water molecules present between the III-V semiconductor layer and the oxide material are forced during manufacturing into the lateral channels, past the periphery of the III-V semiconductor layer, and, through diffusion, out of the oxide material into an atmosphere surrounding the periphery of the III-V semiconductor layer and adjacent the oxide material.

What is claimed is:

1. An integrated circuit, comprising:
   a substrate;
   a buried oxide layer disposed on the substrate;
   a silicon layer disposed on the buried oxide layer, the silicon layer including etched vertical channels extending through the silicon layer to the buried oxide layer, the silicon layer further including etched lateral channels extending only partially into the silicon layer;
   an oxide material disposed on the silicon layer, the oxide material extending into the vertical channels in the silicon layer, the oxide material extending into the lateral channels in the silicon layer; and
   a III-V semiconductor layer disposed on the oxide material, wherein water molecules present between the III-V semiconductor layer and the oxide material are forced during manufacturing through the vertical channels into the buried oxide layer thereby to enhance bonding between the III-V semiconductor layer and the oxide material, the lateral channels extending laterally from an interior of a periphery of the III-V semiconductor layer to an exterior of the periphery of the III-V semiconductor layer.

2. The integrated circuit of claim 1, wherein the vertical channels are positioned in a first repeating pattern across an area of the III-V semiconductor layer.

3. The integrated circuit of claim 2, wherein the lateral channels are positioned in a second repeating pattern around the periphery of the III-V semiconductor layer.

4. The integrated circuit of claim 2, wherein at least some of the vertical channels intersect at least some of the lateral channels.

5. The integrated circuit of claim 1, wherein the oxide material is applied during manufacturing, then polished during manufacturing, to form a planarized oxide layer disposed on the silicon layer.

6. The integrated circuit of claim 5, wherein:
   the III-V semiconductor layer is included on a III-V semiconductor chip; and
   during manufacturing, the III-V semiconductor chip is forced against the planarized oxide layer to force the water molecules through the vertical channels into the buried oxide layer.

7. The integrated circuit of claim 1, wherein, during manufacturing:
   the silicon layer is etched to a first depth to form the lateral channels; and
   the silicon layer is etched to a second depth, different from the first depth, to form waveguides in the silicon layer.

8. The integrated circuit of claim 1, wherein, during manufacturing:
   the silicon layer is etched to a first depth to form the lateral channels and to form waveguides in the silicon layer.

9. The integrated circuit of claim 1, wherein:
   the substrate is formed from silicon (Si);
   the buried oxide layer is formed from silicon dioxide (SiO$_2$);
   the oxide material is silicon dioxide; and
   the III-V semiconductor layer is formed from indium phosphide (InP).

10. A method of manufacturing an integrated circuit, the method comprising:
    providing a silicon-on-insulator wafer including a substrate, a buried oxide layer disposed on the substrate, and a silicon layer disposed on the buried oxide layer;
    etching portions of the silicon layer to create vertical channels extending through the silicon layer to the buried oxide layer and partially etching portions of the silicon layer to create lateral channels in the silicon layer
    applying an oxide material onto the silicon layer, the applied oxide material extending into the vertical channels in the silicon layer;
    placing a III-V semiconductor layer in contact with the oxide material, the lateral channels positioned such that when the III-V semiconductor layer is placed in contact with the oxide material, the lateral channels extend laterally from an interior of a periphery of the III-V semiconductor layer to an exterior of the periphery of the III-V semiconductor layer; and
    forcing the III-V semiconductor layer against the oxide material to force water molecules present at an interface between the III-V semiconductor layer and the oxide material through the vertical channels into the buried oxide layer thereby to enhance bonding between the III-V semiconductor layer and the oxide material.

11. The method of claim 10, further comprising, prior to applying the oxide material:
wherein when the III-V semiconductor layer is forced against the oxide material, at least some of the water molecules present at the interface between the III-V semiconductor layer and the oxide material are forced into the lateral channels, past the periphery of the III-V semiconductor layer, and, through diffusion, out of the oxide material into an atmosphere surrounding the periphery of the III-V semiconductor layer and adjacent the oxide material.

12. The method of claim 11, wherein, when the III-V semiconductor layer is placed in contact with the oxide material:
the vertical channels are positioned in a first repeating pattern across an area of the III-V semiconductor layer; and
the lateral channels are positioned in a second repeating pattern around the periphery of the III-V semiconductor layer.

13. The method of claim 11, wherein at least some of the vertical channels intersect at least some of the lateral channels.

14. The method of claim 11, further comprising, prior to applying the oxide material:
partially etching portions of the silicon layer to create waveguides in the silicon layer.

15. The method of claim 14, wherein:
the silicon layer is etched to a first depth to form the lateral channels; and
the silicon layer is etched to a second depth, different from the first depth, to form waveguides in the silicon layer.

16. The method of claim 15, wherein the silicon layer is etched to a first depth to form the lateral channels and the waveguides in the silicon layer.

17. The method of claim 10, further comprising, after applying the oxide material and prior to placing the III-V semiconductor layer in contact with the oxide material:
polishing the oxide material to form a planarized oxide layer disposed on the silicon layer, wherein the III-V semiconductor layer is placed in contact with the planarized oxide layer.

18. The method of claim 10, wherein:
the III-V semiconductor layer is placed in contact with the oxide material at room temperature; and
the III-V semiconductor layer is forced against the oxide material at ambient pressure and at a temperature greater than room temperature.

19. The method of claim 10, wherein:
the III-V semiconductor layer is placed in contact with the oxide material at room temperature; and
the III-V semiconductor layer is forced against the oxide material in a vacuum and at a temperature greater than room temperature.

20. An integrated circuit, comprising:
a substrate;
a buried oxide layer disposed on the substrate;
a silicon layer disposed on the buried oxide layer, the silicon layer including etched vertical channels extending through the silicon layer to the buried oxide layer, the silicon layer including etched lateral channels extending only partially into the silicon layer;
a planarized oxide layer disposed on the silicon layer, the planarized oxide layer formed from an oxide material that extends into the vertical channels and the lateral channels in the silicon layer; and
a III-V semiconductor layer disposed on the oxide material, the lateral channels extending laterally from an interior of a periphery of the III-V semiconductor layer to an exterior of the periphery of the III-V semiconductor layer, the vertical channels being positioned in a first repeating pattern across an area of the III-V semiconductor layer, the lateral channels being positioned in a second repeating pattern around the periphery of the III-V semiconductor layer,
wherein at least some water molecules present between the III-V semiconductor layer and the oxide material are forced during manufacturing through the vertical channels into the buried oxide layer thereby to enhance bonding between the III-V semiconductor layer and the oxide material, and
wherein at least some water molecules present between the III-V semiconductor layer and the oxide material are forced during manufacturing into the lateral channels, past the periphery of the III-V semiconductor layer, and, through diffusion, out of the oxide material into an atmosphere surrounding the periphery of the III-V semiconductor layer and adjacent the oxide material.

* * * * *